United States Patent [19]
Maki et al.

[11] Patent Number: 5,581,397
[45] Date of Patent: Dec. 3, 1996

[54] OPTICAL-FIBER AMPLIFIER

[75] Inventors: Takanori Maki; Kenji Ohta, both of Kawasaki, Japan

[73] Assignee: Fujitsu Limited, Kanagawa, Japan

[21] Appl. No.: 609,893

[22] Filed: Mar. 4, 1996

Related U.S. Application Data

[63] Continuation of Ser. No. 268,632, Jun. 30, 1994, abandoned.

[30] Foreign Application Priority Data

Dec. 17, 1993 [JP] Japan .................................. 5-318360

[51] Int. Cl.⁶ ............................................ H01S 3/00
[52] U.S. Cl. ................................................... 359/341
[58] Field of Search ............................. 359/341; 372/6

[56] References Cited

U.S. PATENT DOCUMENTS

| | | | |
|---|---|---|---|
| 5,054,876 | 10/1991 | Grasso et al. ................... | 385/24 |
| 5,173,957 | 12/1992 | Bergano et al. . | |
| 5,241,414 | 8/1993 | Giles et al. . | |
| 5,268,786 | 12/1993 | Matsushita et al. ............. | 359/341 |
| 5,287,216 | 2/1994 | Chirravuri et al. .............. | 359/341 |
| 5,299,055 | 3/1994 | Yoneyama ....................... | 359/341 |
| 5,343,320 | 8/1994 | Anderson ........................ | 359/160 |
| 5,355,248 | 10/1994 | Hadjifatiou ..................... | 359/341 |

FOREIGN PATENT DOCUMENTS

| | | |
|---|---|---|
| 8960191 | 6/1992 | Australia . |
| 0532230 | 3/1993 | European Pat. Off. . |
| 0541061 | 5/1993 | European Pat. Off. . |
| 2245757 | 1/1992 | United Kingdom . |
| 2264835 | 9/1993 | United Kingdom . |
| 9211561 | 7/1992 | WIPO . |

*Primary Examiner*—Mark Hellner

[57] ABSTRACT

Pumping light from two pumping light sources is supplied to an optical coupler which splits it into two output beams and supplies the beams to erbium-doped optical fibers in the forward and backward paths, respectively. To avoid the detrimental effect caused by interference that occurs when the wavelengths of the two pumping light sources coincide perfectly with each other, the two pumping light sources are activated alternately by clock signals that are 180° out of phase with each other. Alternatively, optical shutters may be provided between the optical coupler and the respective pumping light source, and these optical shutters may be opened alternately. If one or other of the pumping light sources stops due to failure, the average level of the pumping light supplied to the optical fibers will drop. To compensate for this, it will be preferable to make provision so that when a fault is detected in one light source, pumping light is continuously supplied to the optical coupler from the other pumping light source.

15 Claims, 4 Drawing Sheets

OPTICAL-FIBER AMPLIFIER

This is a continuation of application Ser. No. 08/268,632, filed Jun. 30, 1994.

BACKGROUND OF THE INVENTION

1. Field of the Invention

The present invention relates to an optical-fiber amplifier, and more particularly to an optical-fiber amplifier that directly amplifies optical signals using an erbium-doped optical fiber (hereinafter referred to as optical fiber) through which pumping light is supplied.

2. Description of the Related Art

Optical-fiber amplifiers constructed from optical fibers introduce pumping light from external energy sources into the optical fibers, and directly amplify signal light by stimulated emission of the erbium in the optical fibers. These optical-fiber amplifiers are used in optical repeaters, optical receivers, and other optical communication equipment.

For optical communication equipment, especially, for optical repeaters for undersea cables, duplicate (or redundant) equipment is used in the pumping light source system because a total failure of the pumping light source system would require enormous amounts of time and money to repair. For bi-directional communications, this requires that a total of four pumping light sources, two for each direction of transmission, be provided in a single optical repeater.

On the other hand, an optical amplifier system that achieves a redundant configuration for the transmission lines of both directions using a total of two pumping light sources, is known. In the known system, light energy from the two pumping light sources is input into an optical coupler which combines the light and then splits it into two outputs that are respectively coupled into optical fibers, one for the forward transmission direction and the other for the backward transmission direction. In the event of a failure and stoppage of one or the other of the pumping light sources, light energy from the remaining pumping light source is supplied to both the forward and backward transmission lines.

The two pumping light sources used have an identical output light wavelength in nominal terms. In such a system, when the wavelength of the light energy from one pumping light source is sufficiently separated from that of the light energy from the other pumping light source, the levels of the two sources are stable. However, if the two wavelengths are very close to each other, or if they become very close to each other due to temperature changes, the wavelengths of the two sources will become equal because of light reflected back into the light sources. If this happens, the two pumping beams interfere, and as a result, the levels of the two output beams from the optical coupler fluctuate in an opposite phase relationship with respect to each other. In this case, if the level of one output beam remains small for some time, there arises the problem that the optical signal that is supposed to be amplified by that beam cannot be amplified.

SUMMARY OF THE INVENTION

Accordingly, in an optical-fiber amplifier that amplifies optical signals by first introducing output beams from a plurality of pumping light sources into an optical coupler for splitting into two beams, and then supplying the thus split beams to the forward- and backward- going optical fibers, it is an object of the present invention to prevent the pumping beams split through the coupler from interfering with each other.

According to the present invention, there is provided an optical-fiber amplifier comprising: a plurality of pumping light sources; a combiner/splitter for combining output beams from the plurality of pumping light sources and for splitting the combined beams into plurality of pumping beams; a plurality of optical fibers which are pumped by the respective pumping beams output from the combiner/splitter; and a controller for sequentially enabling the plurality of pumping light sources.

DESCRIPTION OF THE PREFERRED EMBODIMENTS

Figure 1:
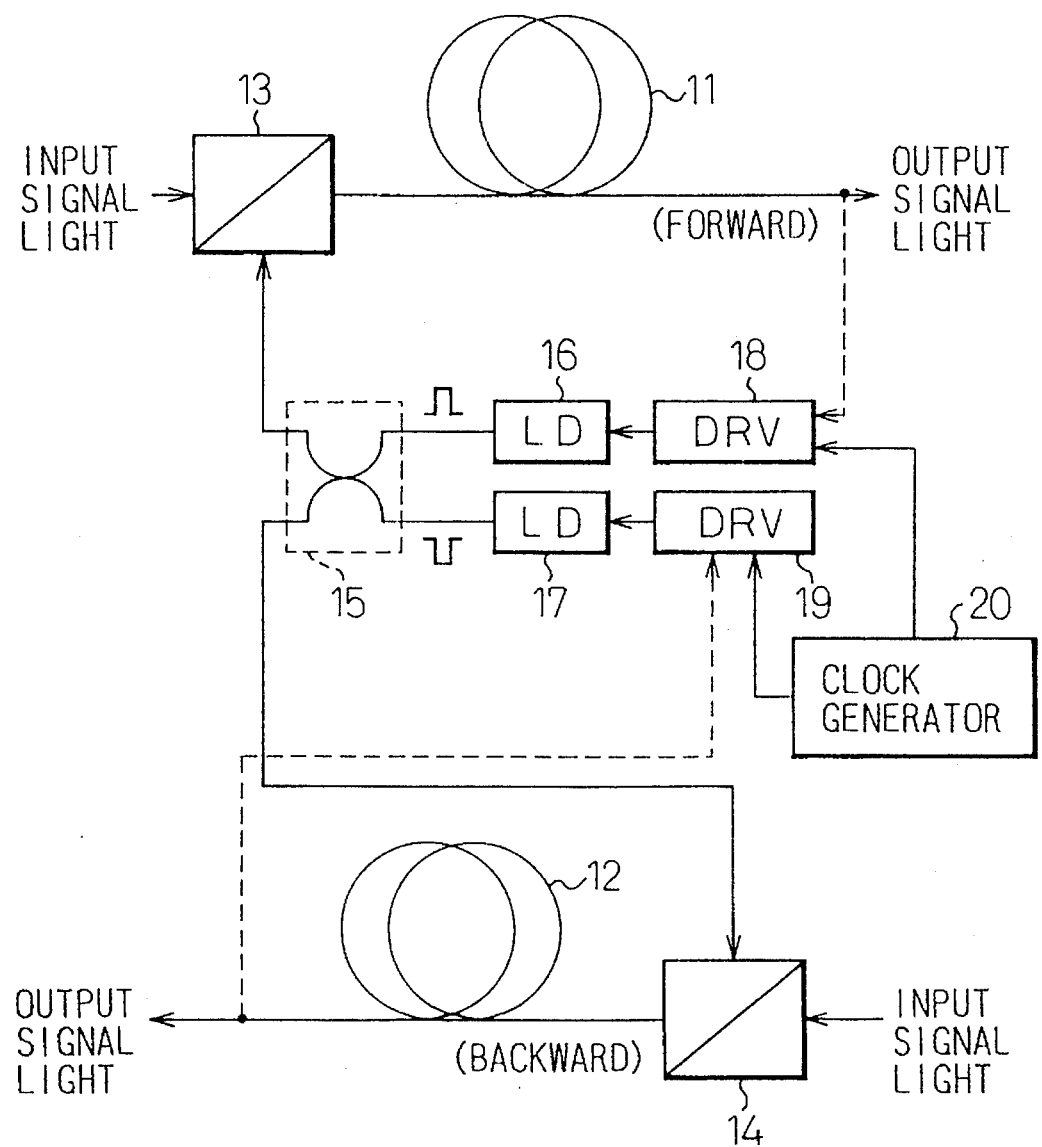
FIG. 1 is a block diagram of an optical-fiber amplifier according to a first embodiment of the invention.

FIG. 1 shows an optical-fiber amplifier according to a first embodiment of the invention. In FIG. 1, the numeral 11 indicates an erbium-doped optical fiber for transmission in the forward direction, and 12 an erbium-doped optical fiber for transmission in the backward direction. The numerals 13 and 14 each designate a combiner that combines input optical signal in the forward or backward direction with the pumping beam and Supplies the combined light to the optical fiber 11 or 12. Indicated at 15 is a coupler (a 3-dB coupler) which splits the pumping beam and directs the split beams to the respective combiners 13 and 14. The numerals 16 and 17 each indicate a laser diode (LD) whose output light is fed into the coupler 15, and the numerals 18 and 19 denote drivers (DRV) for driving the laser diodes 16 and 17, respectively. The drivers 18 and 19 monitor the output light levels of the respective laser diodes 16 and 17, and perform automatic power control (APC) to control the currents fed to the laser diodes 16 and 17 so that their output levels are constant. In addition to, or instead of, performing such control, the output signal beams from the optical fibers 11 and 12 may be monitored to control the output at a constant level. The laser diode 16 with the driver 18 and the laser diode 17 with the driver 19 constitute respective pumping light sources, The laser diodes 16 and 17 driven by the respective drivers 18 and 19 output pumping light. The coupler 15 combines the output beams from the laser diodes 16 and 17, splits the combined light into lights of equal level, and supplies the split beams to the optical fibers 11 and 12 via the respective combiners 13 and 14, thereby amplifying the optical signal by stimulated emission.

If, for example, the laser diode 16 fails or its output is degraded below a tolerable level, the other laser diode 17 can still supply the pumping light of equal level (though the level is reduced) to the combiners 13 and 14 through the coupler 15; thus the failure is compensated for by the redundant configuration of the laser diode pumping light source system.

In the first embodiment of the present invention, a clock generator 20 is included which supplies its output signals to the drivers 18 and 19. The clock generator 20 applies clock signals, one 180° reversed in phase with respect to the other, to the drivers 18 and 19. As a result, the pumping beam output from the laser diodes 16 and 17 that are driven by the drivers 18 and 19 supplied with such 180° out-of-phase clock signals are also 180° Out of phase with respect to each other, that is, one output is ON when the other is OFF, as shown in FIG. 1.

Accordingly, even when the wavelengths of the output beams from the laser diodes 16 and 17 are close to each other, no interference occurs in the coupler 15, and during the ON period of the light pulse from one laser diode, the pumping light from that one laser diode only is split by the coupler 15 into two pumping beams which are supplied to the combiners 13 and 14.

In the above embodiment shown in FIG. 1, if one or other of the two laser diodes 16, 17 becomes degraded, a degraded pumping light beam is fed into the coupler 15 in pulsed form and is further split into two pumping beams for supply to the combiners 13 and 14; since the average level drops, the degree of amplification in the optical fibers 11 and 12 also decreases.

Figure 2:
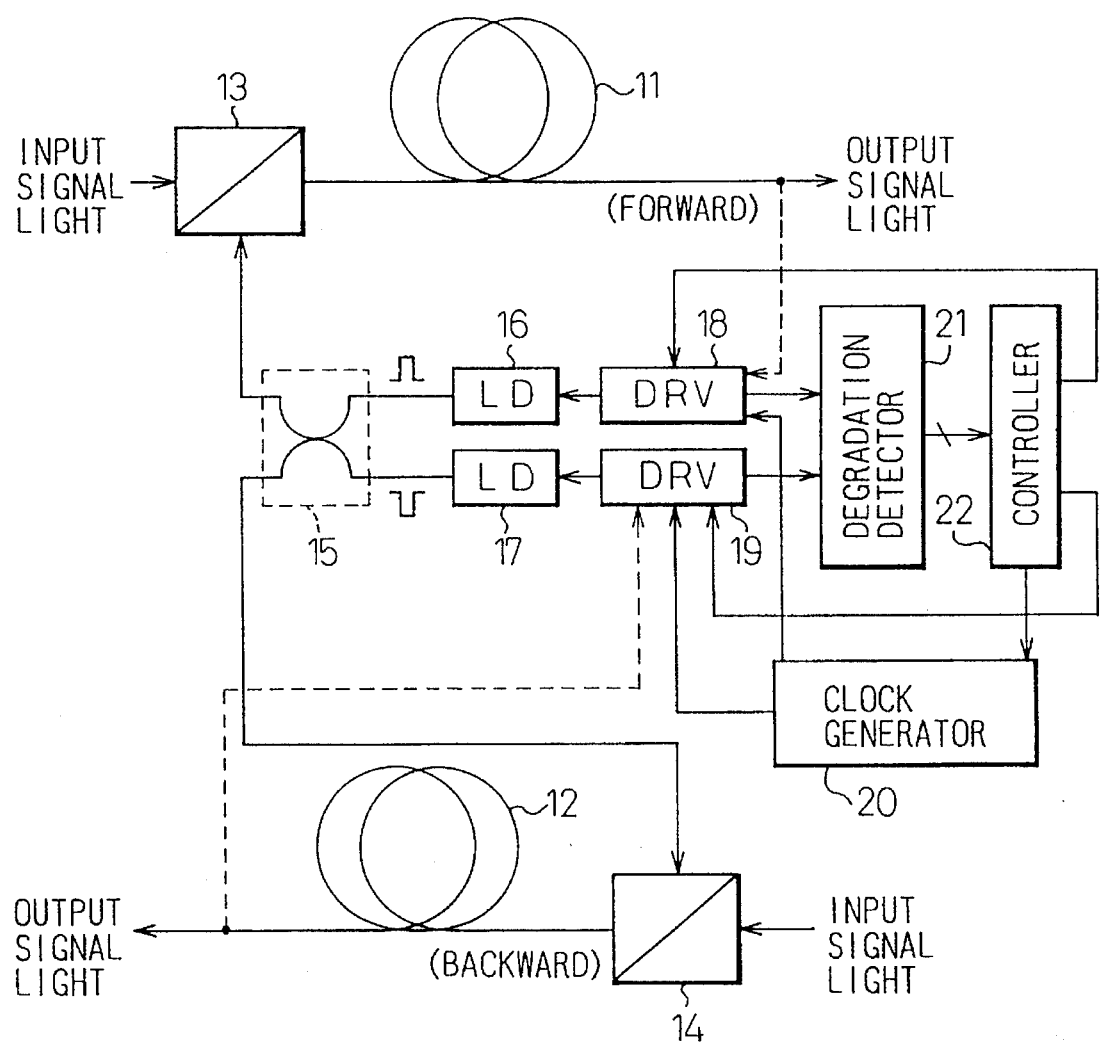
FIG. 2 is a block diagram of an optical-fiber amplifier according to a second embodiment of the invention.

To address this problem, the second embodiment of the invention shown in FIG. 2 provides a configuration that compensates for a degraded level in the event of a failure of either one of the laser diodes.

More specifically, the second embodiment further includes: a degradation detector 21 for detecting degradation of the laser diodes 16, 17 by constantly monitoring the conditions of the drivers 18 and 19 that form part of the respective pumping light sources; and a controller 22 for controlling the drivers 18 and 19 in accordance with an output signal from the degradation detector 21.

Degradation of the laser diodes 16, 17 can be detected, for example, by monitoring the bias voltage applied to raise the output level of the laser diode 16 or 17 when the output level thereof does not increase in the previously described APC (automatic power control) operation being performed by the drivers 18 and 19.

In the operation of the second embodiment, when there are no faults and the system is operating normally, the degradation detector 21 does not detect any degradation, and since the controller 22 operates the clock generator 20 in accordance with the output signal from the degradation detector 21, the second embodiment operates in exactly the same manner as the first embodiment shown in FIG. 1.

On the other hand, if either pumping light source is degraded, for example, if the laser diode 16 forming part of one of the pumping light sources is degraded, then the driver 18 tries to increase the laser output; therefore, by monitoring the condition of the driver 18 at this time, the degradation detector 21 can detect the degradation of the laser diode 16. Upon detection, the degradation detector 21 outputs a two-bit signal to notify the controller 22 of the failure of the pumping light source associated with the laser diode 16. In response to this signal, the controller 22 turns off the clock generator 20 to stop its operation and, at the same time, controls the driver 19 in the normally operating pumping light source so that continuous light is emitted from the laser diode 17. Since the continuous pumping light is supplied to the coupler 15, the two pumping beams fed into the respective combiners 13 and 14 are continuous pumping beams, not pulsed beams.

In the above embodiment, the drivers are controlled using a clock and the output light of each laser diode is controlled in pulsed form. In the third embodiment shown in FIG. 3, this clock is replaced by optical shutters.

Figure 3:
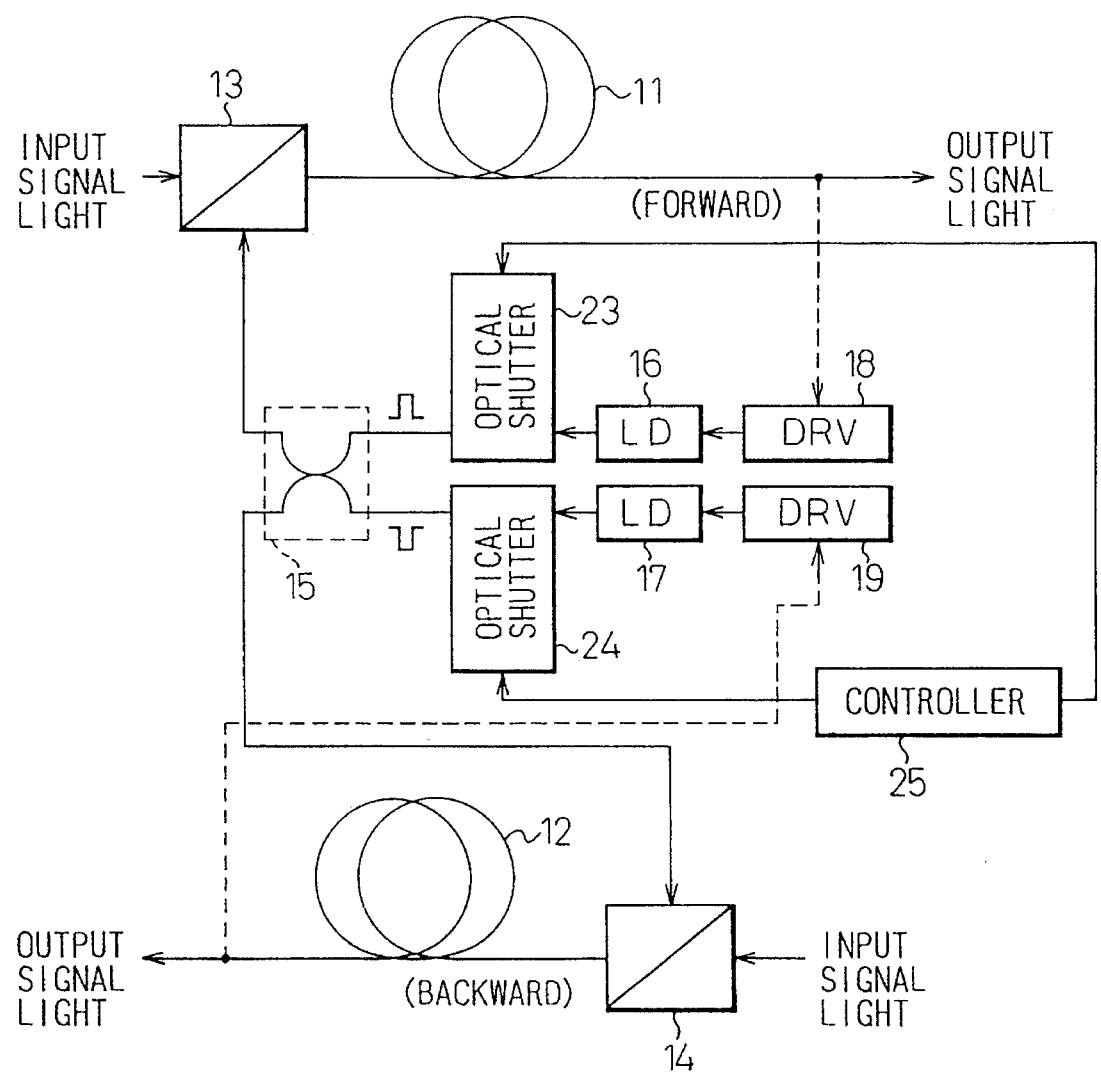
FIG. 3 is a block diagram of an optical-fiber amplifier according to a third embodiment of the invention.

AS shown in FIG. 3, two optical shutters 23, 24 are placed between the coupler 15 and the laser diodes 16, 17, and these shutters 23, 24 are switched on and off by a controller 25.

In the operation of this embodiment, the controller 25 performs control so that the two optical shutters are opened and closed in turn, that is, when the optical shutter 23 is opened, the other optical shutter 24 is closed, and when the optical shutter 24 is opened, the optical shutter 23 is closed.

The laser diodes 16 and 17, which form part of the respective pumping light sources, are driven by the respective drivers 18 and 19 and constantly output continuous beams; since these beams are obstructed or not in reverse phase relationship with each other by the respective optical shutters 13 and 14, two pumping beams are alternately fed from the coupler 15 to the combiners 13 and 14, just as in the first embodiment shown in FIG. 1.

As in the first embodiment shown in FIG. 1, in the third embodiment also, it is necessary to compensate for the level drop when either laser diode 16 or 17 becomes degraded.

Figure 4:
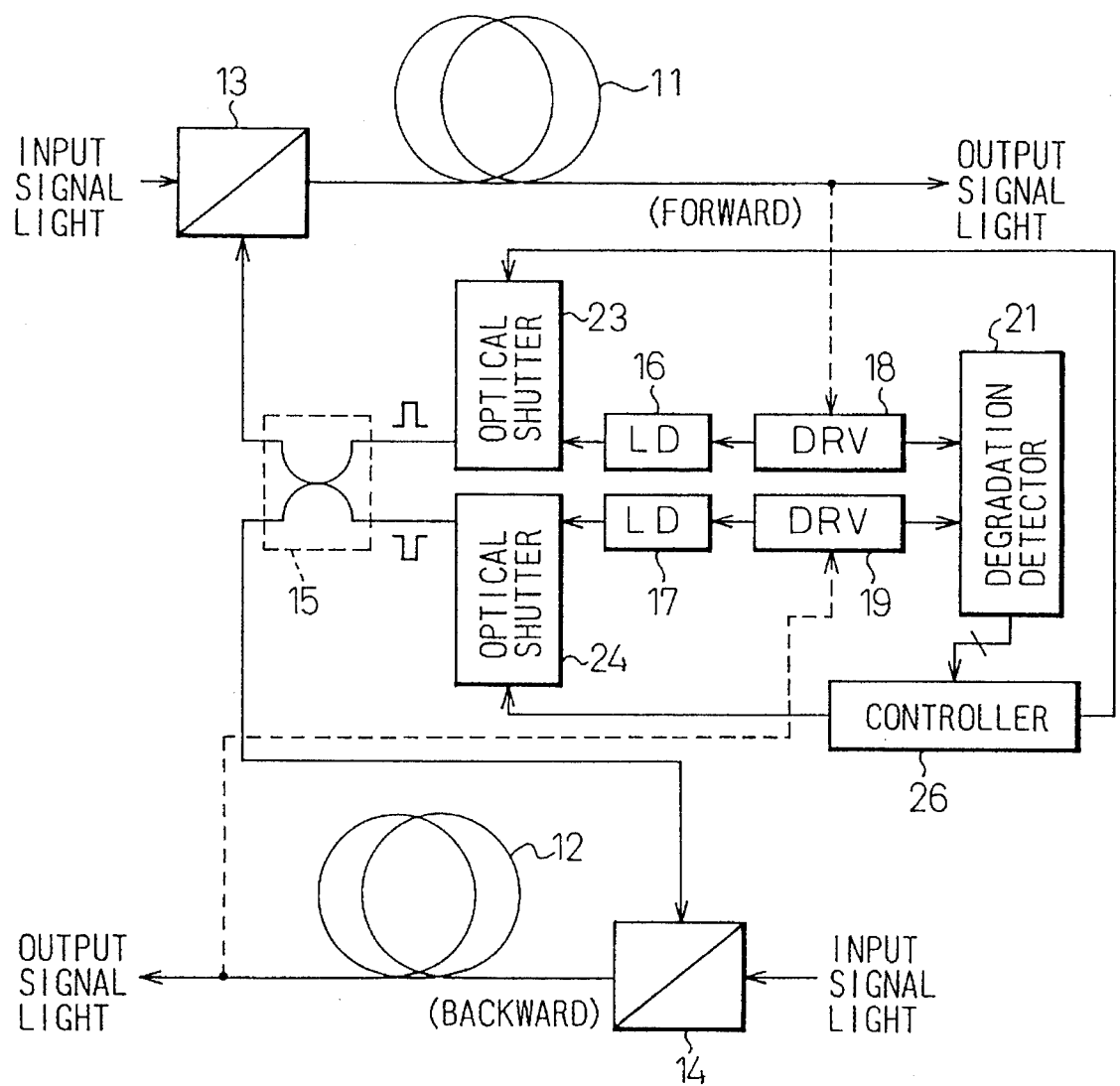
FIG. 4 is a block diagram of an optical-fiber amplifier according to a fourth embodiment of the invention.

To achieve this, in the fourth embodiment shown in FIG. 4, the degradation detector 21 is placed between a controller 26 and the drivers 18, 19 that form part of the respective pumping light sources.

With this configuration, if the laser diode 17, for example, is degraded, the degraded condition is detected by the degradation detector 21 through the driver 19, as in the second embodiment shown in FIG. 2, and the degradation detector 21 determines that the pumping light beam associated with the laser diode 17 is degraded, and notifies the controller 26 accordingly.

Then, the controller 26 controls the optical shutter 23 for the normally operating pumping light beam and keeps the optical shutter 23 open, while keeping turning on and off the other optical shutter 24.

As a result, the continuous output beam from the laser diode 16 is fed through the shutter 23 into the coupler 15 where it is combined with a pulsed beam fed through the optical shutter 24 from the degraded laser diode 17, the resulting continuous pumping beam then being directed to the respective combiners 13 and 14.

Thus, if one of the pumping light beams As degraded, continuous pumping beams are generated at all times so that no adverse effect is caused on the degree of amplification of signal light in the optical fibers 11 and 12.

In the fourth embodiment, if a failure occurs to one or other of the laser diodes, the controller 25 need only perform control so that at least the optical shutter for the normally operating light beam is kept open; in other words, both of the optical shutters 23 and 24 may be kept open, or alternatively, the optical shutter for the degraded light source may be kept closed.

We claim:

1. An optical-fiber amplifier comprising:

a plurality of pumping light sources;

a coupler for receiving output beams from the plurality of pumping light sources and for splitting each of the received beams into a plurality of pumping beams;

a plurality of optical fibers which are pumped respectively by the pumping beams from the coupler; and a controller for alternately enabling the plurality of pumping light sources.

2. An optical-fiber alternately according to claim 1, wherein the pumping light sources each include a light generator and a driver for driving the light generator, and the controller activates the drivers alternately.

3. An optical-fiber amplifier according to claim 2, wherein the plurality of pumping light sources are two pumping light sources which include two respective drivers, and the controller includes a clock generator for generating two clock signals, one 180° reversed in phase with respect to the other, to thereby activate the two drivers alternately.

4. An optical-fiber amplifier according to claim 3, wherein the plurality of optical fibers include two erbium-doped optical fibers that provide bidirectional optical transmission paths, and the optical coupler receives two (input) alternated beams and splits the (combined beam) received beams into two coupler output beams.

5. An optical-fiber amplifier according to claim 1, further comprising fault detecting means for detecting a fault in the pumping light sources, wherein when the fault detecting means detects a fault, the controller continuously enables the pumping light source for which no faults are detected.

6. An optical-fiber amplifier according to claim 1, wherein the pumping light sources each include a light generator and a driver for driving the light generator, and when no faults are detected by the fault detecting means, the controller activates the drivers alternately and, when a fault is detected, continuously activates the driver in the pumping light source for which no faults are detected.

7. An optical-fiber amplifier according to claim 6, wherein the plurality of pumping light sources are two pumping light sources that include two respective drivers, and the controller includes a clock generator for generating two clock signals, one 180° out of phase with respect to the other, to thereby activate the two drivers alternately when no faults are detected by the fault detecting means.

8. An optical-fiber amplifier according to claim 7, wherein the plurality of optical fibers include two erbium-doped optical fibers that provide bidirectional optical transmission paths, and the optical coupler receives two alternated beams and splits the received beams into two coupler output beams.

9. An optical-fiber amplifier according to claim 1, wherein the controller includes a plurality of optical shutters for blocking the output beams from pumping light sources other than the one selected from among the plurality of pumping light sources.

10. An optical-fiber amplifier according to claim 9, wherein the plurality of pumping light sources are two pumping light sources, and the optical shutters alternately block the output lights from the two pumping light sources.

11. An optical-fiber amplifier according to claim 10, wherein the plurality of optical fibers include two erbium doped optical fibers that provide bidirectional optical transmission paths, and the optical coupler receives two alternated beams and splits the received beam into two coupler output beams.

12. An optical-fiber amplifier according to claim 5, wherein the controller includes a plurality of optical shutters which, when no faults are detected by the fault detecting means, block the output beams from a pumping light source other than the one selected from among the plurality of pumping light sources, and when a fault is detected, continuously transmits the output beams from the pumping light source for which no faults are detected.

13. An optical-fiber amplifier according to claim 12, wherein the plurality of pumping light sources are two pumping light sources, and when no faults are detected by the fault detecting means, the optical shutters alternately block the output beams from the two pumping light sources.

14. An optical-fiber amplifier according to claim 13, wherein the plurality of optical fibers include two erbium-doped optical fibers that provide bidirectional optical transmission paths, and the optical coupler receives two alternated beams and splits the received beams into two coupler output beams.

15. A laser diode apparatus comprising:

a plurality of pumping light sources;

a coupler for receiving output beams from the plurality of pumping light sources and for outputting a plurality of pumping beams for each said received beam;

a controller for alternately enabling the plurality of pumping light sorces.

* * * * *